United States Patent
Han et al.

(10) Patent No.: US 9,407,295 B2
(45) Date of Patent: Aug. 2, 2016

(54) DIVERSITY LOOP DETECTOR WITH COMPONENT DETECTOR SWITCHING

(71) Applicant: LSI Corporation, San Jose, CA (US)

(72) Inventors: Yang Han, Sunnyvale, CA (US); Yu Kou, San Jose, CA (US); Xuebin Wu, San Jose, CA (US); Bruce A. Wilson, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 730 days.

(21) Appl. No.: 13/741,482

(22) Filed: Jan. 15, 2013

(65) Prior Publication Data
US 2014/0200849 A1 Jul. 17, 2014

(51) Int. Cl.
*G06F 17/18* (2006.01)
*H03M 13/41* (2006.01)

(52) U.S. Cl.
CPC ................................ *H03M 13/41* (2013.01)

(58) Field of Classification Search
CPC ................................................. G06F 17/18
See application file for complete search history.

(56) References Cited

U.S. PATENT DOCUMENTS

2004/0076245 A1* 4/2004 Okamoto ......... G11B 20/10009
375/341

* cited by examiner

*Primary Examiner* — Manuel Rivera Vargas

(57) ABSTRACT

Aspects of the disclosure pertain to a system and method for providing component detector switching for a diversity loop detector. Switching between component detectors is performed via one of: a periodic state likelihood reset process, a slope-based switching process, or a cross-over connection process. The joint decision circuit switches among component detectors to promote improved performance with present of constant or transition phase offset.

20 Claims, 3 Drawing Sheets

DIVERSITY LOOP DETECTOR WITH COMPONENT DETECTOR SWITCHING

FIELD OF THE INVENTION

The present disclosure relates to the field of read channel systems and particularly to a system and method for providing component detector switching for a diversity loop detector.

BACKGROUND

Read channel front end loops utilize outputs provided by detectors to drive the timing recovery loop. However, these detectors can suffer from performance issues.

SUMMARY

This Summary is provided to introduce a selection of concepts in a simplified form that are further described below in the Detailed Description. This Summary is not intended to identify key and/or essential features of the claimed subject matter. Also, this Summary is not intended to limit the scope of the claimed subject matter in any manner.

Aspects of the disclosure pertain to a system and method for providing component detector switching for a diversity loop detector.

BRIEF DESCRIPTION OF THE FIGURES

The detailed description is described with reference to the accompanying figures.

WRITTEN DESCRIPTION

Embodiments of the invention will become apparent with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will fully convey the scope. Among other things, the features of the disclosure can be facilitated by methods, devices, and/or embodied in articles of commerce. The following detailed description is, therefore, not to be taken in a limiting sense.

Figure 1:
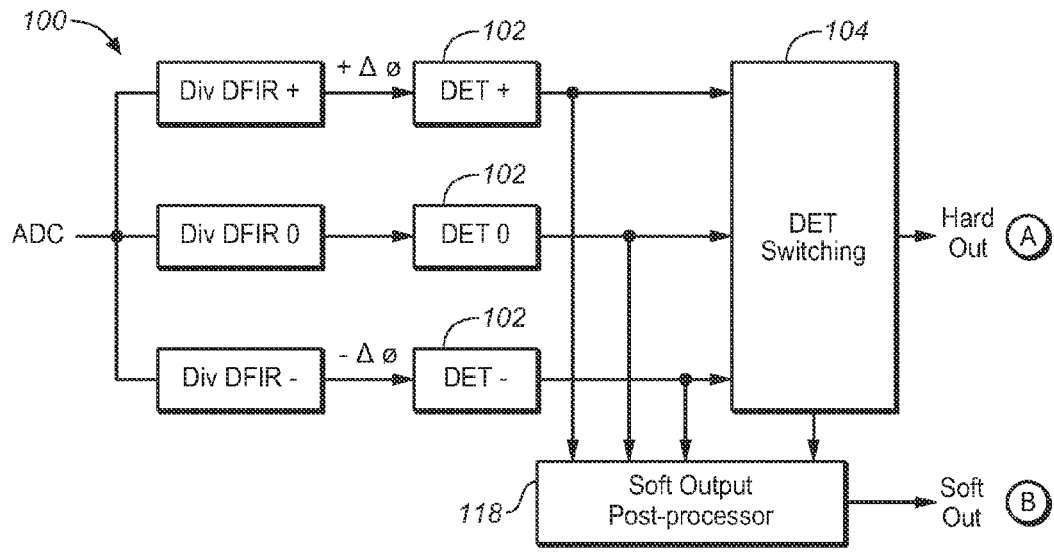
FIG. 1 is an example conceptual block diagram schematic of a loop detector system in accordance with an exemplary embodiment of the present disclosure.

Referring to FIG. 1, a system 100 is shown. In embodiments, the system 100 is a loop detector system (e.g., a loop detector, a diversity loop detector). In embodiments, the loop detector 100 is implemented in a read channel system. For example, the loop detector 100 can be implemented in/with a front end loop of a read channel system. In embodiments, the system 100 includes a plurality of component detectors 102. For example, the system 100 can include three component detectors 102, as shown in FIG. 1. In embodiments, each of the component detectors 102 is configured for receiving a different input (e.g., a Digital Finite Impulse Response (DFIR)).

In embodiments, the plurality of component detectors 102 are configured for working in parallel for achieving optimal performance jointly at different conditions. In embodiments, each component detector 102 has a different phase offset, direct current (DC) offset, or gain offset. In embodiments, each component detector 102 is configured for operating optimally at a different phase/DC/gain offset region. In embodiments, the diversity delta is programmable for achieving the overall best across different regions of with diversity.

In embodiments, the system 100 further includes a selection circuit (e.g., a joint selection circuit, a hard decision and Log-Likelihood-Ratio (LLR) generation circuit, a switching circuit) 104. In embodiments, the selection circuit 104 is connected to the plurality of component detectors 102. In embodiments, the selection circuit 104 is configured for switching among (e.g., selecting between) the component detectors 102 for achieving better performance with present of constant or transition phase offset. In embodiments, the selection circuit 104 is configured for providing LLR generation for the joint decision of the component detectors 102.

Figure 2:
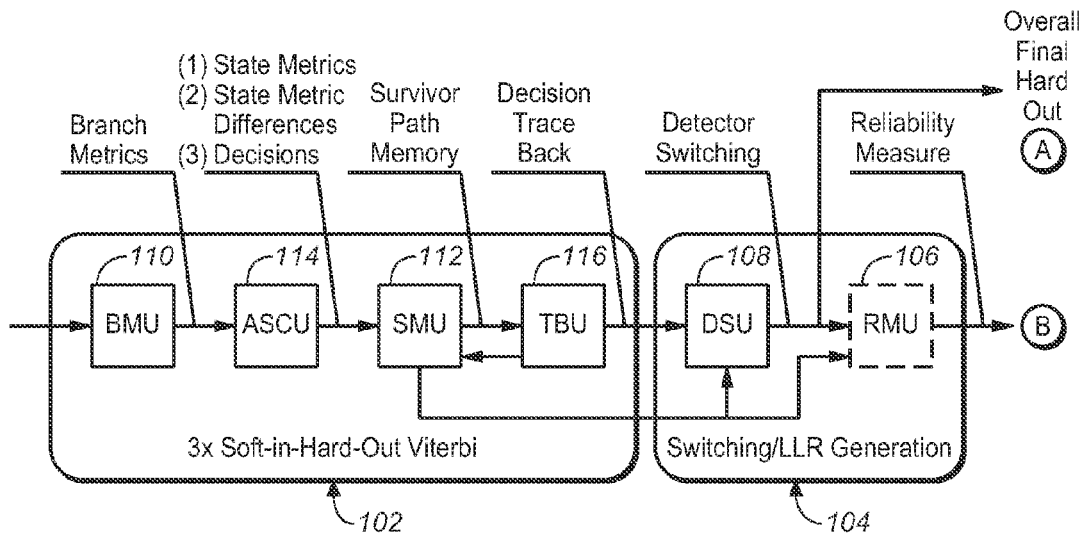
FIG. 2 is an example conceptual block diagram schematic of a component detector and a selection circuit of the loop detector system shown in FIG. 1.

Referring to FIG. 2, one of the component detectors 102 of the system 100 and the selection circuit 104 are shown. In embodiments, each of the component detectors 102 are soft-in hard-out detectors which utilize a standard Viterbi algorithm. In embodiments, the component detectors 102 are configured for generating outputs (e.g., hard decision outputs) based upon the received inputs (e.g., DFIRs). In embodiments, the component detectors 102 are configured for providing the generated outputs (e.g., hard decision outputs) to the selection circuit 104. In embodiments, the selection circuit (e.g., switching/LLR generation circuit) 104 is configured for receiving the generated outputs (e.g., hard decision outputs) from the component detectors 102. In embodiments, the selection circuit 104 includes a reliability measure unit (RMU) 106. In embodiments, the RMU is configured for generating a LLR based upon (e.g., for) the generated outputs (e.g., hard decision outputs) received from the detectors 102. In embodiments, the selection circuit 104 includes a detector switching unit (DSU) 108, the DSU 108 being connected to the RMU 106. In embodiments, the DSU 108 is configured for selecting the output of one of the component detectors 102 for a jointly better decision.

In embodiments, a 4-state trellis of the loop detector 100 is generated based on a 3-tap loop detector target. In embodiments, branch outputs are calculated from: linear expansion of channel target taps, or error event-based calibrated channel ideas from an independent block. In embodiments, fixed point definition is optimized for target with main tap equal to 1.

In embodiments, each component detector 102 includes a branch metrics unit (BMU) 110. In embodiments, the BMU 110 is configured for receiving the input (e.g., DFIR) provided to the component detector 102 and generating an output (e.g., branch metrics output) based upon the received input. In embodiments, the BMU 110 (e.g., 4T Equivalent Trellis), at full-rate, takes one input (e.g., sample "c") and generates one output:

$$B_k([ab]c) = (y_k - \hat{y}^{[ab] \to [bc]})^2$$

where "a" is the earlier bit (e.g., most significant bit (MSB)) and "c" is the most recent bit (e.g., least significant bit (LSB)).

There are 8 branch metrics at time "k". At quarter-rate, the BMU 110 takes four inputs (sample "cdef") and generates four outputs:

$$B_k([ab]cdef)=B_k([ab]c)+B_k([bc]d)+B_k([cd]e)+B_k([de]f)$$

In embodiments, there are 64 branch metrics for one quarter-rate clock.

In embodiments, the BMU 110 is configured for pre-selecting one of the four parallel branches connection states. For example, 64 branches may be reduced to 16 branches in the 4T trellis. In embodiments, to provide such pre-selection, the BMU 110 is configured with sixteen 4-way comparators. In embodiments, each 4T branch metric is associated with two pre-selected hard decision outputs for sample "c" and "d", which are memorized and put to a path metric buffer by a survivor path metric unit (SMU) 112 of the component detector 102:

$$B_k([ab]\ldots ef) = \min\{B_k([ab]00ef), B_k([ab]01ef), B_k([ab]10ef), B_k([ab]11ef)\}$$

In embodiments, a state metric update is provided via the following:

$$S_k(ef) = \min\{S_{k-4}(00)+B_k([00]\ldots ef), S_{k-4}(01)+B_k([01]\ldots ef), S_{k-4}(10)+B_k([10]\ldots ef), S_{k-4}(11)+B_k([11]\ldots ef)\}$$

In embodiments, each component detector 102 includes an add-compare-select unit (ASCU) 114. In embodiments, the ASCU 114 is connected to the BMU 110. In embodiments, the ASCU 114 is configured for receiving an output (e.g., branch metrics output) from the BMU 110. In embodiments, the ASCU 114 is configured for generating an output based upon the received output from the BMU 110 and the state metrics from the previous cycle. In embodiments, the ASCU output includes data (e.g., information) regarding: state metrics, state metric differences and decisions. In embodiments, the ASCU 114 may be a 4T ASCU. In embodiments, a 4T ASCU 114 includes: four 2-way adders and one 4-way comparator. A 1T ASCU will have a different configuration. In embodiments, the ASCU selects one of four incoming branches to update the status metric for a given state. In embodiments, each component detector 102 includes four ASCUs. In embodiments, because branch metrics are always non-negative, a circuit is required to prevent state metric accumulator overflow. In embodiments, if the maximum difference between 2-way comparisons are bounded, then modulo $2^x$ arithmetic is implemented with:

$$2^x > 2 \cdot \text{Bound}$$

The comparison of A and B is always correct when calculating the subtraction D=A−B with x bits. When the MSB of D is 1, A<B and, when MSB of D is 0, A is greater than or equal to B. All calculations that involve state metrics, including addition and subtraction comparisons, are modulo-based calculations, so the roll-over is consistent. In embodiments, for the 4-state trellis, the bound is proved theoretically via the following:

$$Bnd_{SM,AT} = 2 Bnd_{BM,AT}$$

In embodiments, as mentioned above, each component detector 102 includes a survivor path metric unit (SMU) 112. In embodiments, the SMU 112 is connected to the ASCU 114. In embodiments, the SMU 112 is configured for receiving an output transmitted by the ASCU 114. As mentioned above, in embodiments, the ASCU output includes data (e.g., information) regarding: state metrics, state metric differences and decisions. In embodiments, the SMU 112 is configured for storing survivor path data (e.g., a surviving path for each trellis state during a time window). In embodiments, the SMU 112 includes a first buffer (e.g., hard decision (HD) buffer) which is configured for storing HD bits corresponding to the winning branch merging to a state. For example, the length of the HD buffer is TBBL=12 samples. In embodiments, the SMU 112 includes a second buffer (e.g., hard out buffer) which is configured for storing final hard decisions (e.g., the 11 most recent final hard decisions) from the loop detector 100 for reconstructing the decision path/competing path of the RMU 106. In embodiments, the SMU 112 includes a third buffer (e.g., a Y buffer) which is configured for storing y samples (e.g., the 17 most recent y samples) for path metric re-computation in the RMU 106.

In embodiments, each component detector 102 includes a trace back unit (TBU) 116. In embodiments, the TBU 116 is connected to the SMU 112. In embodiments, the TBU 116 is configured for obtaining (e.g., retrieving) data (e.g., survivor path memory data) from the SMU 112. In embodiments, in response to obtaining data from the SMU 112, the TBU 116 is configured for generating an output and transmitting it to the SMU 112, the output being received by the SMU 112. In embodiments, the SMU 112 is configured for determining (e.g., memorizing) the output of the ACSU 114 and the TBU 116. Content in buffers of the SMU 112 is used in (e.g., obtained/retrieved by) the TBU 116 and the RMU 106. In embodiments, based upon the data obtained from the SMU 112, the TBU 116 of each component detector 102 is configured for generating a further output (e.g., a decision trace back output, hard decision output) and transmitting the decision trace back output (e.g., hard decision output) from the component detector 102 to the DSU 108. In embodiments, a register exchange method is provided for and/or implemented by the SMU 112. For example, the SMU 112 stores (e.g., keeps) values of decisions of the ASCU 114 directly, so the TBU 116 is simply taking the HD directly. In embodiments, at time k, the 4 state metrics of each component detector are compared. In embodiments, the state with the minimum accumulative state metric is then chosen as the winning state. In embodiments, the TBU 116 begins trace back from this trellis state to k−TBL+1 time instance to determine the hard outputs of each component detector 102. In embodiments, the TBU 116 compares the updated state metrics (e.g., the four updated state metrics) for a component detector 102, finds the minimum state, then traces back from that state to generate the final hard decision for the detector 102, which will be provided to a hardout buffer of the SMU 112.

Figure 4:
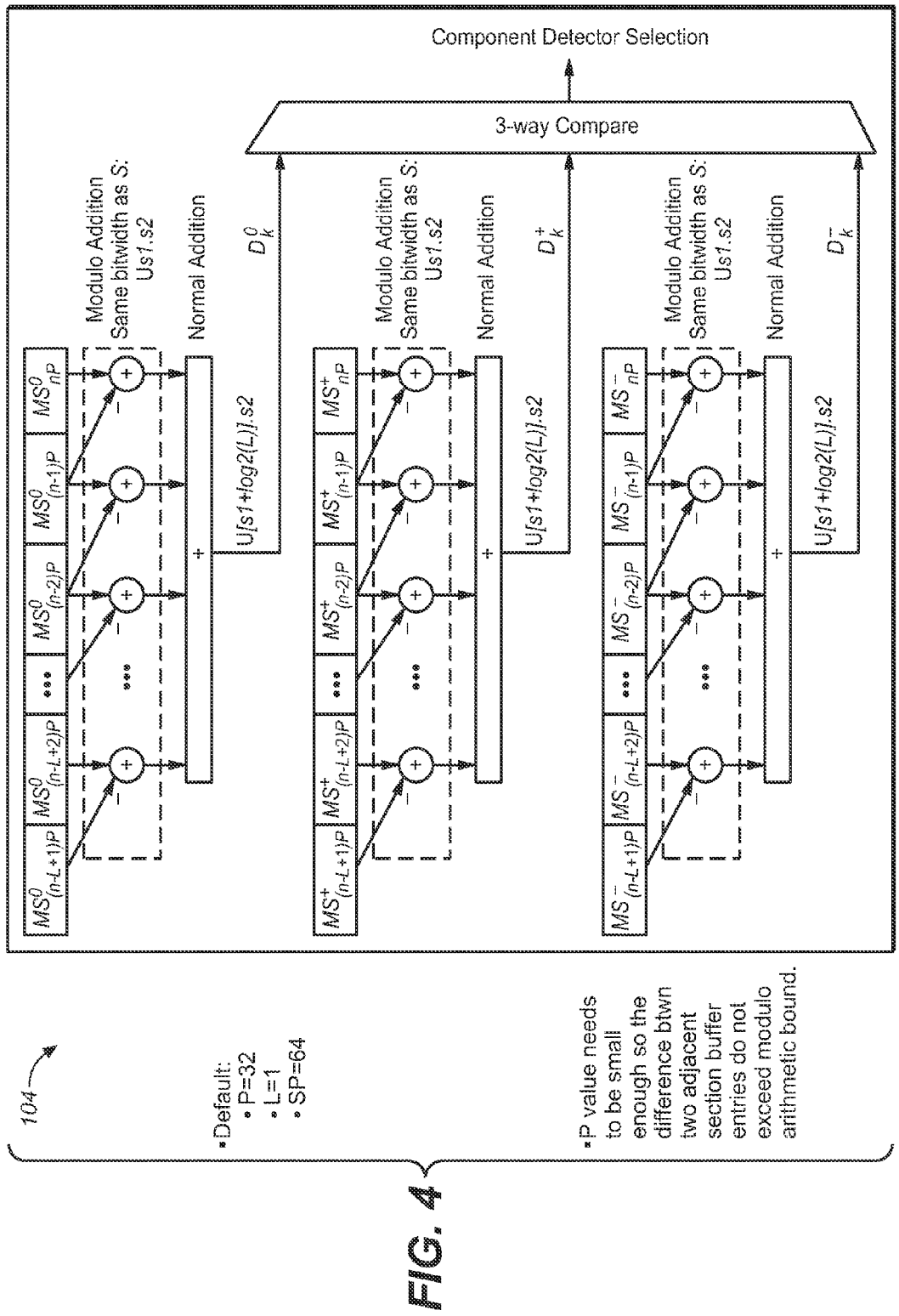
FIG. 4 is an example conceptual block diagram schematic of the selection circuit the loop detector system shown in FIG. 1, the selection circuit performing component detector selection.

In embodiments, as mentioned above, the selection circuit 104 includes a DSU 108 and a RMU 106. In embodiments, the DSU 108 is configured for receiving the output (e.g., decision trace back output, a hard decision output) from the TBU 116 and, based upon the output received from the TBU 116, generating and transmitting an output (e.g., a detector switching output) to the RMU 106. As mentioned above, the DSU 108 is configured for selecting the output of one of the component detectors 102 (e.g., performing detector switching) and generating and transmitting the detector switching output to the RMU 106. In embodiments, the DSU 108 is configured for performing detector switching utilizing any one or more of a variety of possible switching detector methods. For example, the DSU 108 may implement minimum state metric (SM) switching, periodic state likelihood reset, cross-over connections among detectors or differentiator-based switching. The detector switching methods which may be implemented by the DSU 108 of the selection circuit 104 are discussed in further detail below. In embodiments, the DSU 108 is configured for taking a minimum state metric value (e.g., a result from a four-way comparison performed by the TBU 116) and buffering it in a sliding buffer for slope calculation. In embodiments, the RMU 106 is configured for receiving the detector switching output transmitted from the DSU 108. In embodiments, the RMU 106 is configured for obtaining data from the SMU 112. In embodiments, the RMU 106 is configured, based upon the data obtained from the SMU 112 and/or the output received from the DSU 108, for generating and transmitting an output (e.g., a reliability measure output, a hard decision output (hard out)) for the loop detector 100. In embodiments, the RMU 106 is configured for estimating the LLR of hard decision outputs of each component detector 102. In embodiments, the RMU 106 is configured for comparing the hard decision path with all possible competing paths leading to a different decision within the reliability update window. The advantage is to separate from the main hard decision data path to keep latency short. For example, the Reliability Update Length (RUL) may be 6. Further, the number of different branches between the decision path and the competing path is less than or equal to 6 (e.g., less than or equal to 4 bits difference). In embodiments, at time k, the hard decision for time [k−11, k−10, k−9, k−8] are generated and LLR values (LLRs) for [k−16, k−15, k−14, k−13] can be calculated. In embodiments, the four LLRs generated in one quarter-rate clk may not be from the same component detector. In embodiments, the output (e.g., DSU detector selection signal) of the DSU 108 is used by the RMU 106 to determine which Y buffer and/or hard out buffer in the SMU 112 to receive (e.g., take) as input to the RMU for each sample whose LLR is to be calculated. In embodiments, the RMU 106 obtains/receives the following: the Y buffer of the SMU 112, the hard out buffer of the SMU 112, and the selection signal from the DSU 108 (e.g., about which component detector 102 is selected). FIG. 4 provides an example conceptual block diagram schematic of the selection circuit 104 for the loop detector system 100, the selection circuit 104 performing component detector selection.

In embodiments, the system 100 further includes a post-processing unit (e.g., a soft output post-processor) 118. As mentioned above, the RMU 106 of the selection circuit 104 is configured for generating and transmitting an output (e.g., hard out) for the system 100 (e.g., loop detector). In embodiments, the selection circuit 104 is configured for transmitting the RMU output (e.g., hard out) to the post-processor 118. The post-processor 118 is further configured for receiving the outputs (e.g., decision trace back outputs, hard decision outputs) from the component detectors 102. Based upon the outputs received from the selection circuit (e.g., detector (DET) switching circuit) 104 and the outputs received from the component detectors 102, the post-processor 118 is configured for generating and transmitting an output (e.g., a soft information output (soft out)). In embodiments, the post-processor 118 is deactivated (e.g., powered off) when soft information is not required.

As mentioned above, in embodiments, the loop detector 100 is configured for implementation in/with a front end loop of a read channel system. For example, a read channel front end loop can use the hard decisions generated by the loop detector 100 for driving a timing recovery loop. The loop detector 100 described herein promotes short hard decision latency for driving the timing recovery loop. The loop detector 100 described herein promotes improved performance with residue phase/gain/DC offsets.

As mentioned above, the diversity detector 100 implements a plurality of component detectors 102 for handling different phase/gain/DC offsets. However, the component detectors 102 are not necessarily limited to handling only different phase/gain/DC offsets. Also, as mentioned above, the joint selection circuit 104 is configured for switching among the component detectors 102 for promoting improved performance with present of constant or transition phase/gain/DC offset. In order to do this, selecting the operating component detector 102 for a given time/condition and promptly switching between component detectors 102 is critical. Further, as mentioned above, the component detectors 102 work in parallel for promoting optimal joint performance.

In embodiments, the selection circuit 104 is configured for implementing any one of a number of methods for promoting fast switching amongst the component detectors 102. For example, the switching methods which can be implemented includes: periodic state likelihood reset; slope-based switching; and cross-over connections among detectors. In embodiments, optimal switching is accurate in picking the operating detector 102 and has minimal delay in timing.

In embodiments, state likelihood reset is implemented by the selection circuit 104 for switching amongst the component detectors 102. In embodiments in which state likelihood reset is implemented by the loop detector 100, the minimum (min) state of each of the component detectors 102 is reset to zero periodically. In embodiments, the relative ranking of state likelihood is maintained within detectors 102. In embodiments, reset should not be too frequent, as it could adversely affect zero phase performance. In embodiments, reset promotes improved performance in the range of 0.1 to 0.3 phase offset.

In embodiments, cross-over connections among detectors is implemented by the selection circuit 104 for switching amongst the component detectors 102. In some embodiments in which cross-over connections (e.g., cross-over bridge) amongst detectors is implemented by the loop detector 100, periodic cross-over with a state metric (SM) penalty occurs. In embodiments, the cross-over connection is on the Viterbi trellis.

In embodiments, slope-based switching (e.g., sectional slope-based switching) is implemented by the selection circuit 104 for switching amongst the component detectors 102. In embodiments, switching based on the slope of minimum accumulative state metric growth promotes accurate and fast switching in case of a transition phase offset. In embodiments, because slope-based switching doesn't affect the critical data path, there are minimal delays and fixed point modulo arithmetic still holds, thereby promoting ease of parameter optimization. In embodiments, slope-based switching implements multiple (e.g., three) sliding window minimum state metric buffers, each of which buffers one minimum state metric value every LDSW_BUF_PERIOD (P) samples (e.g., one section).

Figure 3:
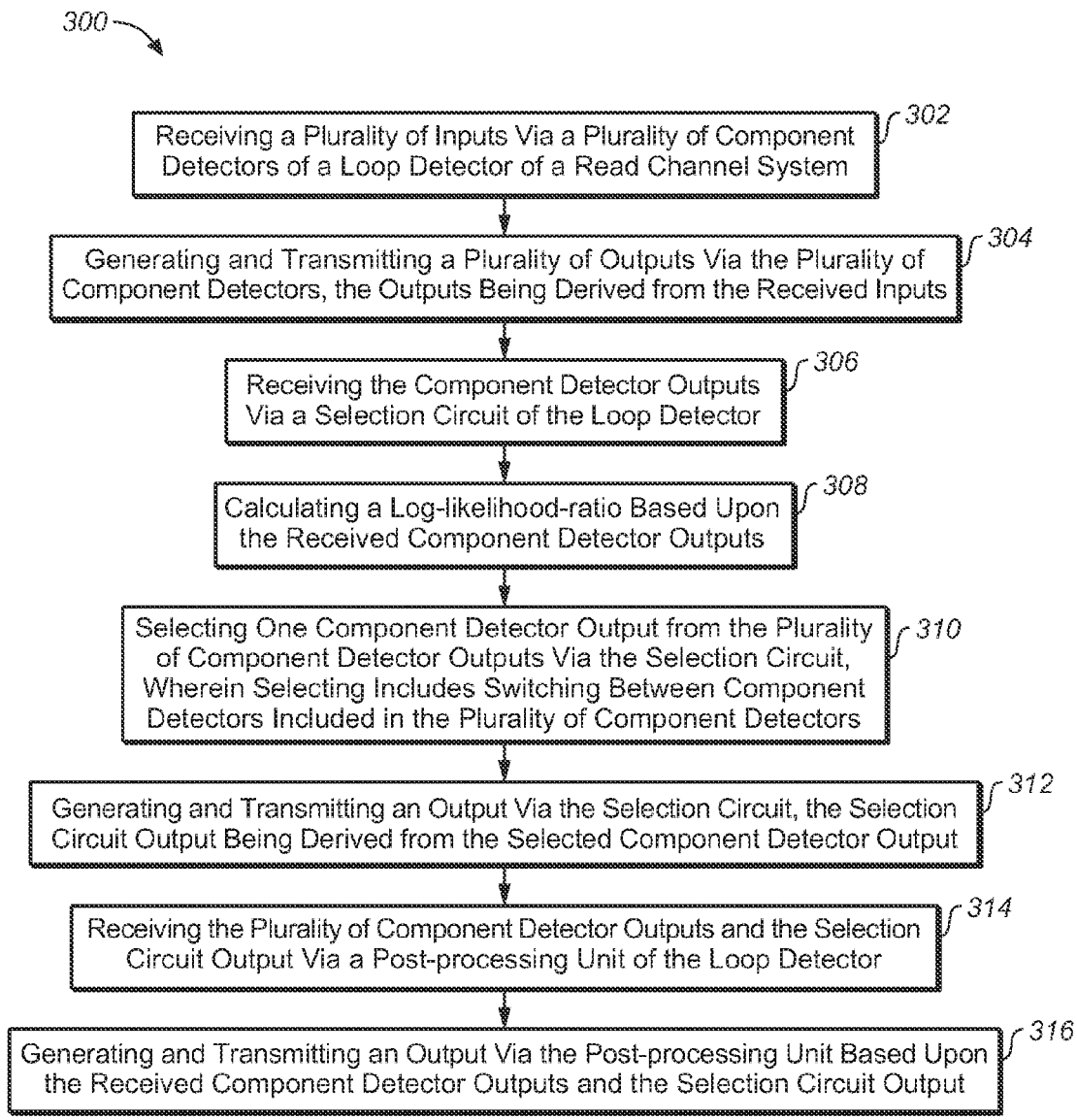
FIG. 3 is a flow chart illustrating a method of operation of the loop detector system shown in FIGS. 1 and 2, in accordance with an exemplary embodiment of the present disclosure.

FIG. 3 is a flowchart illustrating a method of operation of the loop detector system 100. In embodiments, the method 300 includes the step of receiving a plurality of inputs via a plurality of component detectors of the loop detector system of a read channel system 302. In embodiments, the method 300 further includes the step of generating and transmitting a plurality of outputs via the plurality of component detectors, the outputs being derived from the received inputs 304. In embodiments, the method 300 further includes the step of receiving the plurality of component detector outputs via a selection circuit of the loop detector system 306. In embodiments, the method 300 further includes the step of calculating a log-likelihood-ratio based upon the received component detector outputs 308. In embodiments, the log-likelihood-ratio is calculated by the selection circuit. In embodiments, the method 300 further includes the step of selecting one component detector output from the plurality of component detector outputs via the selection circuit 310, wherein selecting includes switching between component detectors included in the plurality of component detectors. In embodiments, switching between component detectors is performed via one of: a periodic state likelihood reset process, a slope-based switching process, or a cross-over connection process. In embodiments, the method 300 further includes the step of generating and transmitting an output via the selection circuit 312, the selection circuit output being derived from the selected component detector output. In embodiments, the method 300 further includes the step of receiving the plurality of component detector outputs and the selection circuit output via a post-processing unit of the loop detector system 314. In embodiments, the method 300 further includes the step of generating and transmitting an output via the post-processing unit based upon the received component detector outputs and the selection circuit output 316.

It is to be noted that the foregoing described embodiments may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the embodiments described herein may be conveniently implemented in forms of a software package. Such a software package may be a computer program product which employs a non-transitory computer-readable storage medium including stored computer code which is used to program a computer to perform the disclosed functions and processes disclosed herein. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:
    a plurality of component detectors configured for receiving a plurality of inputs and transmitting a plurality of outputs based upon the received plurality of inputs; and
    a selection circuit connected to the plurality of component detectors, the selection circuit configured for receiving the plurality of component detector outputs, the selection circuit configured for selecting one component detector output from the plurality of component detector outputs, the selection circuit configured for providing an output based upon the selected component detector output, the selection circuit further being configured for calculating a log-likelihood-ratio based upon the received component detector outputs,
    wherein at least two component detectors included in the plurality of component detectors have a different amount of offset.

2. The system as claimed in claim 1, wherein each component detector included in the plurality of component detectors includes a branch metrics unit, the branch metrics unit configured for receiving an input included in the plurality of inputs, the branch metrics unit further configured for generating and transmitting an output based upon the received input.

3. The system as claimed in claim 2, wherein each component detector included in the plurality of component detectors includes an add-compare-select unit, the add-compare-select unit being connected to the branch metrics unit, the add-compare-select unit configured for receiving the branch metrics unit output, the add-compare-select unit further configured for generating and transmitting an output based upon the received branch metrics input.

4. The system as claimed in claim 3, wherein each component detector included in the plurality of component detectors includes a survivor path metric unit, the survivor path metric unit being connected to the add-compare-select unit, the survivor path metric unit configured for receiving the add-compare-select unit output, the survivor path metric unit further configured for storing data obtained via the received add-compare-select unit output.

5. The system as claimed in claim 4, wherein each component detector included in the plurality of component detectors includes a trace back unit, the trace back unit being connected to the survivor path metric unit, the trace back unit configured for obtaining data from the survivor path metric unit, the trace back unit further configured for generating and transmitting an output based upon the obtained survivor path metric unit data.

6. The system as claimed in claim 5, wherein the selection circuit includes a detector switching unit, the detector switching unit of the selection circuit configured for receiving the plurality of component detector outputs, the detector switching unit further configured for selecting the one component detector output from the plurality of component detector outputs, the detector switching unit further configured for generating and transmitting an output, the detector switching unit output including a detector selection signal indicating the component detector output selected by the detector switching unit.

7. The system as claimed in claim 6, wherein the selection circuit includes a reliability measure unit, the reliability measurement unit being connected to the detector switching unit, the reliability measurement unit also being connected to the survivor path metric unit, the reliability measure unit configured for receiving the detector selection signal from the detector switching unit, the reliability measure unit configured for generating and transmitting the selection circuit output based upon the received detector selection signal.

8. The system as claimed in claim 7, wherein the reliability measure unit is configured for calculating the log-likelihood ratio based upon the received detector selection signal and a buffer input received from the survivor path metric unit.

9. The system as claimed in claim 1, wherein selecting the one component detector output includes switching between component detectors.

10. The system as claimed in claim 9, wherein switching between component detectors is performed via one of: a periodic state likelihood reset process, a slope-based switching process, or a cross-over connection process.

11. The system as claimed in claim 1, further comprising:
    a post-processing unit connected to the plurality of component detectors and the selection circuit, the post-processing unit configured for receiving the plurality of component detector outputs and the selection circuit output, the post-processing unit further configured for generating and transmitting an output based upon the received component detector outputs and the selection circuit output.

12. The system as claimed in claim 1, wherein the offset is a phase offset, gain offset, or direct current offset.

13. The system as claimed in claim 1, wherein the system is a loop detector system configured for implementation within a read channel system.

14. The system as claimed in claim 1, wherein all of the component detectors included in the plurality of component detectors are operating in parallel.

15. A system, comprising:
a plurality of component detectors operating in parallel, the plurality of component detectors configured for receiving a plurality of inputs and transmitting a plurality of outputs based upon the received plurality of inputs, at least two component detectors included in the plurality of component detectors have a different amount of offset, wherein the offset is a phase offset, gain offset, or direct current offset; and
a selection circuit connected to the plurality of component detectors, the selection circuit configured for receiving the plurality of component detector outputs, the selection circuit configured for selecting one component detector output from the plurality of component detector outputs, wherein selecting the one component detector output includes switching between component detectors included in the plurality of component detectors, the selection circuit configured for providing an output based upon the selected component detector output, the selection circuit further being configured for calculating a log-likelihood-ratio based upon the received component detector outputs,
wherein the system is a loop detector system configured for implementation within a read channel system.

16. The system as claimed in claim 15, wherein switching between component detectors is performed via one of: a periodic state likelihood reset process, a slope-based switching process, or a cross-over connection process.

17. The system as claimed in claim 15, further comprising:
a post-processing unit connected to the plurality of component detectors and the selection circuit, the post-processing unit configured for receiving the plurality of component detector outputs and the selection circuit output, the post-processing unit further configured for generating and transmitting an output based upon the received component detector outputs and the selection circuit output.

18. A method of operation of a loop detector system, the method comprising:
receiving a plurality of inputs via a plurality of component detectors of a loop detector system of a read channel system; generating and transmitting a plurality of outputs via the plurality of component detectors, the outputs being derived from the received inputs;
receiving the plurality of component detector outputs via a selection circuit of the loop detector system;
calculating a log-likelihood-ratio based upon the received component detector outputs;
selecting one component detector output from the plurality of component detector outputs via the selection circuit, wherein selecting includes switching between component detectors included in the plurality of component detectors; and
generating and transmitting an output via the selection circuit, the selection circuit output being derived from the selected component detector output.

19. The method as claimed in claim 18, further comprising:
receiving the plurality of component detector outputs and the selection circuit output via a post-processing unit of the loop detector system; and
generating and transmitting an output via the post-processing unit based upon the received component detector outputs and the selection circuit output.

20. The method as claimed in claim 18, wherein switching between component detectors is performed via one of: a periodic state likelihood reset process, a slope-based switching process, or a cross-over connection process.

* * * * *